United States Patent [19]

Prentice

[11] Patent Number: 4,464,631

[45] Date of Patent: Aug. 7, 1984

[54] CIRCUIT FOR TRIMMING FET DIFFERENTIAL PAIR OFFSET VOLTAGE WITHOUT INCREASING THE OFFSET VOLTAGE TEMPERATURE COEFFICIENT

[75] Inventor: John S. Prentice, Palm Bay, Fla.

[73] Assignee: Harris Corporation, Melbourne, Fla.

[21] Appl. No.: 326,345

[22] Filed: Dec. 1, 1981

[51] Int. Cl.³ .......................... H03F 1/30; H03F 3/45
[52] U.S. Cl. ..................................... 330/253; 330/256
[58] Field of Search ................ 330/253, 256, 257, 261

[56] References Cited

U.S. PATENT DOCUMENTS

| | | | |
|---|---|---|---|
| 3,188,576 | 6/1965 | Lewis, Jr. | 330/256 |
| 3,449,687 | 6/1969 | Knauber et al. | 330/253 |
| 3,506,926 | 4/1970 | Shoemaker | 330/256 |
| 3,528,022 | 9/1970 | Adams | 330/256 |
| 3,757,239 | 9/1973 | Langan | 330/253 |
| 3,851,270 | 11/1974 | Vosteen | 330/256 X |
| 4,050,030 | 9/1977 | Russell | 330/256 |

Primary Examiner—James B. Mullins
Attorney, Agent, or Firm—Barnes & Thornburg

[57] ABSTRACT

A circuit for trimming the offset voltage of a differential amplifier is provided comprising a pair of FET input transistors forming an input stage to the amplifier, and an offset adjustment circuit comprising a temperature-dependent resistive network for reducing post-trim offset voltage drift. The offset voltage is a function of a mismatch between the drain-to-source currents of the inputs transistors. The offset adjustment circuit provides for initial trimming of the offset voltage and automatic post-trim reduction of drift by decreasing this drain-to-source current mismatch to track the decrease in non-controllable device mismatch.

12 Claims, 3 Drawing Figures

CIRCUIT FOR TRIMMING FET DIFFERENTIAL PAIR OFFSET VOLTAGE WITHOUT INCREASING THE OFFSET VOLTAGE TEMPERATURE COEFFICIENT

BACKGROUND OF THE INVENTION

This invention relates, in general, to differential amplifiers and, more particularly, to a circuit for reducing the offset voltage drift of a differential amplifier when the amplifier's offset voltage is trimmed.

An ideal differential amplifier has zero output voltage when the differential inputs thereto are equal. It is well known, however, that commercially-available differential amplifiers are far from ideal, giving rise to a finite offset voltage. This voltage is defined as the output voltage of the amplifier divided by its gain when the differential inputs are tied together. The offset voltage, which is a function of mismatched input transistors in the differential amplifier, causes an undesirable difference in the currents between the input and subsequent stages of the amplifier.

The offset voltage drift of a differential amplifier is a measure of the change in the offset voltage relative to changes in temperature. It is known in the prior art to provide an offset adjustment circuit which reduces the magnitude of the temperature-induced offset voltage drift after the offset voltage has been initially trimmed. An example of such a post-trim drift adjustment circuit is disclosed in U.S. Pat. No. 4,050,030 to Russell.

In the Russell patent, the offset adjustment circuit 14 includes a current source JFET 38 connected in series with a resistor 40 for establishing a biasing voltage for a pair of JFET's 42 and 44 connected to variable resistors 46 and 48, respectively. During the trimming portion of the operation, the currents through JFET's 42 and 44 are adjusted through variable resistors 46 and 48 to cancel the amplifier offset voltage via conductors 34 and 36. Any post-trim temperature variations will then change the conduction level of the JFET 38 such that the bias of JFET's 42 and 44 will also change. Specifically, any temperature change, which increases the offset voltage, also tends to increase the drain currents of JFET's 42 and 44 by an equal amount. Therefore, the offset voltage provided by the offset adjustment circuit remains independent of temperature such that the amplifier produces minimal post-trim offset voltage drift.

The adjustment circuit of the Russell patent is theoretically an efficient design for minimizing offset drift. However, in reality, the JFET pairs 42 and 44 and 22 and 24 therein tend to contribute to the amplifier offset voltage drift. Specifically, the JFET's produce a finite drift which results from the fact that the temperature coefficients of these adjustment components differ from the temperature coefficients of the input transistors being adjusted. Russell recognized this problem and provided that the temperature coefficients of the components of both the adjusting circuit and the input stage be theoretically equal. It is known, however, that even with the best manufacturing processes, JFET mismatch between two transistors on the same microchip can be as high as a few percent. Any mismatch between components in the offset adjustment circuit of the Russell patent will increase the overall amplifier offset voltage and offset voltage drift.

Another approach for reducing differential amplifier offset voltage drift with temperature is seen in the Langan Patent, U.S. Pat. No. 3,757,239, which discloses a drift reduction method for a D.C. amplifier having bipolar input transistors. In this patent, the offset voltage is initially trimmed by a potentiometer 19, which adjusts the voltage difference between the emitters of input transistors 10 and 11 to exactly zero. Subsequently, trim resistors 12 and 13 are shorted and the amplifier is subjected to a known temperature change. The drift characteristic of the amplifier is measured and then utilized to determine the temperature coefficients of the trim resistors. More specifically, at least one of the trim resistors 12 or 13 is provided with an opposite polarity temperature coefficient with respect to the temperature coefficient of the offset voltage so as to minimize the overall amplifier drift.

The Langan patent, thus, shows the use of a resistive network in the emitter load of a differential amplifier to reduce offset voltage drift. However, the Langan method requires two separate steps: the first step serving to trim the offset voltage through resistor 10, and the second step to determine the proper temperature characteristics of the trim resistors 12 and 13. Furthermore, the Langan circuit requires the use of an additional high gain feedback loop to stabilize the collector currents of the input transistors 10 and 11. The need for an additional method step in Langan, as well as the extra circuitry described therein, limits the flexibility of this trimming scheme.

Summarizing the scope of the prior art, the trimming of differential amplifier offset voltage without increasing the offset voltage drift is taught by the Russell patent. However, as noted above, the Russell circuit is not efficient where component mismatch exists in the offset adjustment circuit. The Langan patent also discloses a circuit for reducing offset voltage drift but requires a trimming scheme with two separate steps and the use of additional circuitry.

Therefore, there exists a need to provide a post-trim offset voltage drift adjustment circuit for a differential amplifier which is less sensitive to active component mismatch in the adjustment circuit and which only requires a single trim step at a single temperature.

SUMMARY OF THE INVENTION

It is, therefore, an object of the instant invention to provide a differential amplifier which includes an offset adjustment circuit for reducing offset voltage drift when the amplifier's offset voltage is trimmed.

It is another object of the instant invention to provide an offset adjustment circuit for a differential amplifier which is highly insensitive to active component mismatch therein.

It is a further object of the instant invention to provide an offset adjustment circuit for a differential amplifier which requires only a single step trimming scheme.

It is still another object of the instant invention to provide a differential amplifier with reduced post-trim offset voltage drift.

These and other objects of the instant invention are provided by a circuit for trimming the offset voltage of a differential amplifier which includes a pair of FET input transistors forming an input stage to the amplifier, and an offset adjustment circuit comprising a temperature-dependent resistive network for reducing post-trim offset voltage drift. The offset voltage is a function of a plurality of factors including the mismatch between the drain-to-source currents of the input transistors, and the mismatches from among several variables which characterize the FET's. The former mismatch is controllable by changing circuit constraints, while the latter mismatches are not controllable except during manufacture. The offset adjustment circuit provides for initial trimming of the offset voltage by providing a source-to-drain current mismatch to compensate for the FET mismatch, and automatic post-trim reduction of drift by causing the drain-to-source current mismatch to track the decrease in the magnitude of the non-controllable FET mismatches as temperature increases. Therefore, only a single step trimming procedure is required to reduce offset and drift.

The offset adjustment circuit comprises two sets of series-connected resistances in the drain circuits of the JFET input transistors. Each series-connection includes a low temperature coefficient trim resistor and a large, positive temperature coefficient non-trim resistor. The offset adjustment circuit does not adversely contribute to the offset voltage or drift thereof since the resistors can be made nearly identical by state-of-the-art manufacturing techniques.

DETAILED DESCRIPTION OF THE PREFERRED EMBODIMENT

Figure 1:
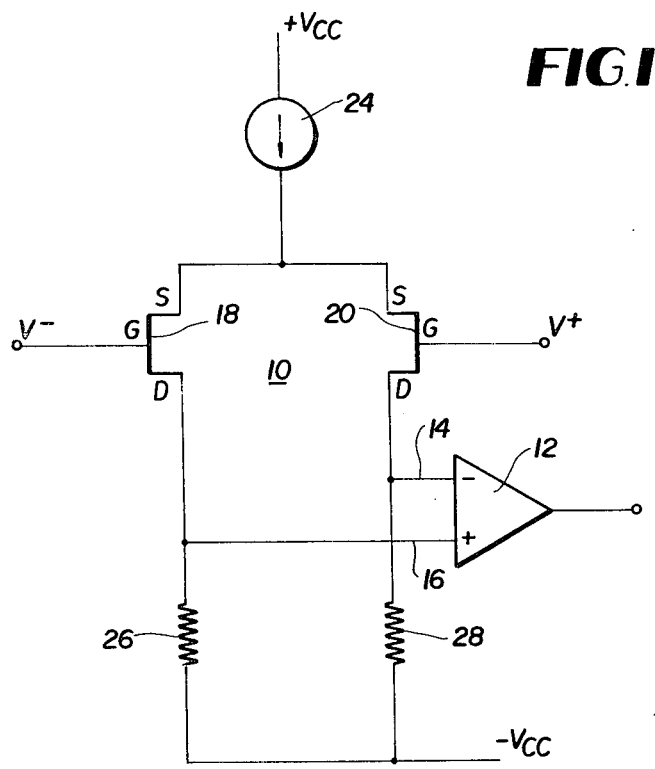
FIG. 1 shows a schematic diagram of the input stage of a differential amplifier having resistor load incorporating the novel offset adjustment circuit of the instant invention.

Referring now to FIG. 1, the instant invention is shown incorporated in the input stage 10 of a differential amplifier. The input stage 10 is connected to the second stage of the amplifier, designated by operational amplifier 12, via conductors 14 and 16. The input stage 10 comprises a pair of JFET transistors 18 and 20, each having a gate G, drain D, and source S. The sources of the transistors are connected at node 22 to form a differential input stage, as is well-known in the prior art. The inverted input signal is applied to the gate of JFET 18, while the non-inverted input signal is applied to the gate of JFET 20. The JFET's 18 and 20 are biased by constant current source 24 connected between the supply voltage $V_{CC}$ and node 22. Resistors 26 and 28 connect the drain paths of the JFET's 18 and 20 to the negative terminal of the supply voltage. These resistors, as will be described in detail below, provide an improved differential amplifier wherein the post-trim offset voltage drift is minimized.

As discussed above, when the gates of the JFET's 18 and 20 are shorted together, an offset voltage $V_{OFFSET}$ is produced by mismatches between the input transistors 18 and 20. The offset voltage for a differential pair of JFET's has been calculated as follows:

$$V_{OFFSET} = \Delta V_P \left[ 1 - \left(\frac{I_{DS}}{I_{DSS}}\right)^{\frac{1}{2}} \right] + \quad (1)$$

-continued
$$\frac{V_P}{2}\left[\left(\frac{I_{DS}}{I_{DSS}}\right)^{\frac{1}{2}}\left(\frac{\Delta I_{DSS}}{I_{DSS}} - \frac{\Delta I_{DS}}{I_{DS}}\right)\right]$$

where:
- $I_{DS}$ = average value of drain-source currents of FET's 18 and 20,
- $\Delta I_{DS}$ = mismatch in drain-source current between JFET's,
- $I_{DSS}$ = average value of the drain-source currents of FET's 18 and 20 if the gate is shorted to the source,
- $\Delta I_{DSS}$ = mismatch in $I_{DSS}$ between JFET's,
- $V_P$ = pinch-off voltages of FET's 18 and 20; i.e., the gate-source voltage required for $I_{DS}=0$, and
- $\Delta V_P$ = mismatch in $V_P$ between JFET's.

The $\Delta I_{DS}$ parameter described above is a measure of the mismatch in the drain-to-source currents between the input JFET transistors 18 and 20. More specifically, each of the input transistors has a controllable drain-to-source current $I_{DS}$ which is determined by the biasing of the transistor. The difference between the drain-to-source currents of the JFET input transistors 18 and 20 define the drain-to-source current mismatch parameter $\Delta I_{DS}$. As seen in equation (1), the offset voltage $V_{OFFSET}$ is a function of this circuit-controllable parameter.

Referring to equation (1) above, the terms $I_{DSS}$ and $V_P$ characterize the JFET and are not dependent upon circuit constraints. As stated above, however, the value of the drain-source current $I_{DS}$ depends principally on the circuit components. It can, therefore, be seen that the offset voltage may be effectively zeroed if the $I_{DS}$ mismatch, which can be controlled by changing the circuit constraints, is made to cancel the sum of the $V_P$ and $I_{DSS}$ mismatches.

Analytically, assuming $V_{OFFSET}$ is zero, the above premise can be seen by manipulating equation (1) as follows:

$$\Delta V_P\left(1 - \left(\frac{I_{DS}}{I_{DSS}}\right)^{\frac{1}{2}}\right) = \frac{-V_P}{2}\left(\frac{I_{DS}}{I_{DSS}}\right)^{\frac{1}{2}}\frac{\Delta I_{DSS}}{I_{DSS}} +$$

$$\frac{V_P}{2}\left(\frac{I_{DS}}{I_{DSS}}\right)^{\frac{1}{2}}\frac{\Delta I_{DS}}{I_{DS}}$$

Solving the above equation for $\Delta I_{DS}/I_{DS}$ yields the following:

$$\frac{\Delta I_{DS}}{I_{DS}} = \frac{\Delta I_{DSS}}{I_{DSS}} + \frac{2\Delta V_P}{V_P}\left(\left(\frac{I_{DSS}}{I_{DS}}\right)^{\frac{1}{2}} - 1\right) \quad (2)$$

Equation (2) verifies that the offset voltage $V_{OFFSET}$ can be minimized by cancelling the sum of the $I_{DSS}$ and $V_P$ mismatches with the $I_{DS}$ mismatch, which is a variable subject to circuit constraints. It should also be noted that the variables $I_{DSS}$ and $V_P$ are interdependent such that the factors $\Delta I_{DSS}/I_{DSS}$ and $\Delta V_P/V_P$ have correlated magnitudes and the same mathematical sign. Furthermore, the magnitude of both of these factors decrease as temperature increases. Therefore, to maintain $V_{OFFSET}=0$ at any temperature, $\Delta I_{DS}/I_{DS}$ must also decrease with increased temperature.

The present invention provides an offset adjustment circuit which forces the magnitude of the $\Delta I_{DS}/I_{DS}$ factor to decrease with increased temperature so as to track the temperature response of the non-controllable factors $\Delta I_{DSS}/I_{DSS}$ and $\Delta V_P/V_P$, thereby minimizing the offset voltage drift.

Figure 2:
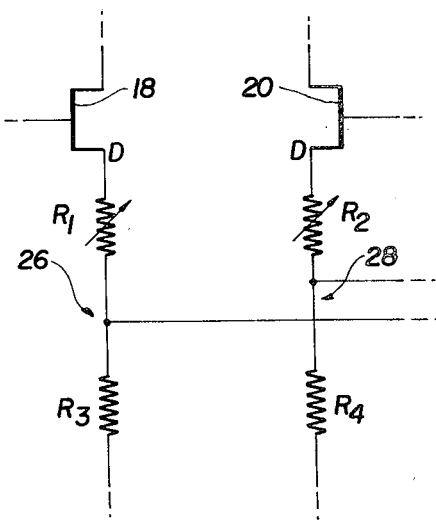
FIG. 2 shows a more detailed schematic of the preferred embodiment of the offset adjustment circuit of FIG. 1.

Referring back to FIG. 1, the quantity $\Delta I_{DS}/I_{DS}$ can be represented by the ratio $\Delta R/R$, where R is the average value of resistance of the resistors 26 and 28 and $\Delta R$ is the mismatch between these resistances. The preferred embodiment of the resistor network of FIG. 1 is seen in FIG. 2 and resistors R1, R2, R3 and R4. This network comprises the offset adjustment circuit for reducing post-trim offset voltage drift as will be described in more detail below. More specifically, resistors R1 and R3, which correspond to resistor 26 in FIG. 1, are series-connected in the drain circuit of the input JFET 18. Similarly, resistors R2 and R4, which correspond to resistor 28 in FIG. 1, are series-connected in the drain circuit of the input JFET 20. It is an important aspect of the present invention that resistors R1 and R2, which are the trim resistors, each have a zero or low temperature coefficient. Moreover, the resistors R3 and R4, which comprise the non-trim resistors, each have relatively larger temperature coefficients such that these resistances have larger resistances at higher temperatures. In the preferred embodiment, resistors R3 and R4 are equal.

The trim resistors R1 and R2 are trimmable to initially reduce the offset voltage by any of the prior art resistive trimming techniques, such as laser trimming, blowing fusable links, or shorting diodes. Such techniques are, of course, well known in the prior art and form no part of the present invention. As stated above, the trim resistors R1 and R2 are formed from a low temperature coefficient material, such as a nickel-chromium alloy, and thus their values are relatively insensitive to ambient temperature changes.

Referring now back to FIG. 2, the following relationships in the offset adjustment circuit can be written:

$R = \frac{1}{2}(R1+R2+R3+R4)$, and since R3=R4;
$\Delta R = R1 - R2$

Note that $\Delta R$ does not change with temperature once the resistors R1 and R2 have been trimmed because these resistors are formed from a low temperature coefficient material. However, it is clear from the first equation above that R will increase with increasing temperature due to the temperature dependence of resistors R3 and R4. Therefore, the ratio $\Delta R/R$, which is equivalent to the factor $\Delta I_{DS}/I_{DS}$, decreases in magnitude as temperature increases. Referring now to equation (2), and recalling that the magnitudes of the factors on the right side of the equation also decrease as temperature increases, it can be seen that the voltage offset $V_{OFFSET}$ is effectively minimized by the resistive network structure provided in FIG. 2. This reduction is originally achieved by the trimming of resistors R1 and R2. However, the resistive network of FIG. 2 provides an additional benefit of minimizing the post-trim offset voltage drift. This additional benefit is achieved by the use of the low and high temperature coefficient resistors as described above wherein the low temperature coefficient resistors are trimmed. Moreover, the circuit does not require two trimming steps as in the prior art. More specifically, once the offset voltage is trimmed, the magnitude of the post-trim offset voltage drift is automatically decreased by the novel structure of the resistance network of FIG. 2.

It should be further noted that the offset adjustment circuit does not adversely contribute to the amplifier offset voltage, as in the prior art. In particular, it is well-known that resistor mismatch can be made as low as a few hundredths of a percent by state-of-the-art manufacturing techniques. Therefore, since the R pre-trim mismatch is much lower than the corresponding mismatch between the transistor components of prior art offset adjustment circuits, the post-trim offset drift is considerably smaller.

In the preferred embodiment of the invention, the trim resistors R1 and R2 are formed by a thin film process and have temperature coefficients on the order of 0.005%/°C. The non-trim resistors R3 and R4, are diffused resistors and have positive temperature coefficients on the order of 0.25%/°C. These values are, of course, by way of example only and are not provided for limitation purposes. It should be appreciated that other types of resistors with various temperature coefficients can be used effectively in the resistor network of the offset adjustment circuit.

It can, therefore, be seen that an improved circuit for reducing post-trim differential amplifier offset voltage drift has been provided which requires only a single step trimming scheme and which reduces the sensitivity of the circuit to active component mismatch on the offset adjustment circuit. More specifically, the offset adjustment circuit of the instant invention includes a resistor network which serves to cancel the effects of the mismatches of JFET parameters $V_P$ and $I_{DSS}$, thus, serving to reduce the offset voltage drift when offset voltage is trimmed and thereafter.

Figure 3:
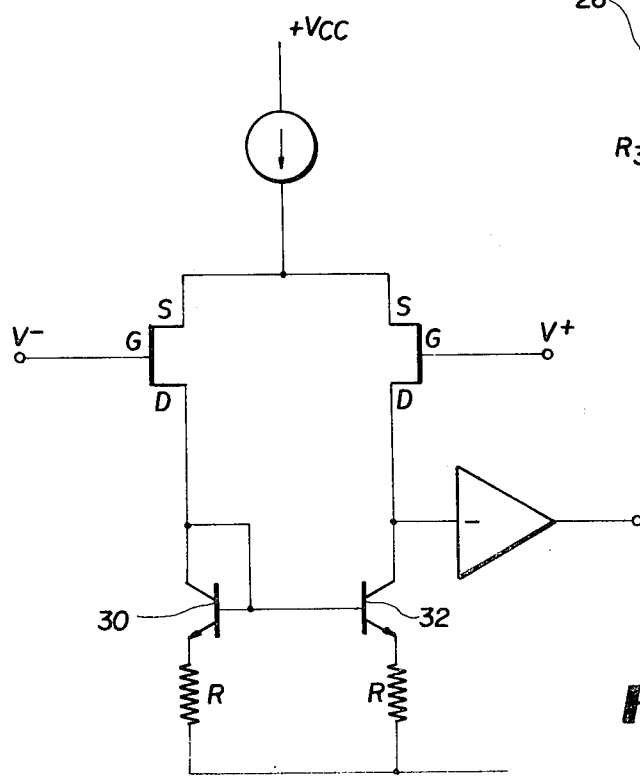
FIG. 3 shows a schematic diagram of another input stage of a differential amplifier having an active load incorporating the novel offset adjustment circuit of the instant invention.

Another differential amplifier circuit similar to that of FIG. 1 is illustrated in FIG. 3. The circuit in FIG. 3 includes an active load instead of the resistive load of FIG. 1. As in FIG. 1, the differential amplifier of FIG. 2 includes an input stage 10 and a second state operational amplifier 12. The input stage includes a pair of JFET transistors 18 and 20 having their sources connected at a node 22 to a constant current source 24. The drain of the JFET's 18 and 20 are connected to the collector of bipolar transistors 30 and 32, respectively. Connected between the emitter of the bipolar transistors 30 and 32 and the supply voltage $-VCC$ are the resistors 26 and 28, respectively. The collector of the bipolar transistor 30 is connected to its base and thereby forms a current mirror. The output of the first stage by connector 14 is connected to the input of the output stage operational amplifier 12. The addition of the transistors 30 and 32 to form active loads increases the circuit voltage gain and allows the second state amplifier 12 to have a single ended input instead of the differential input of FIG. 1. The trimming technique of the present invention is incorporated in resistors 26 and 28 as illustrated in FIG. 2. The important relationship of the present invention, namely, $\Delta I_{DSS}/I_{DS} = \Delta R/R$ is true as long as R is substantially greater than $kT/qI_{DS}$ where k is Boltzman's constant, T is temperature and q is electron charge.

Although the present invention has been described in FIGS. 1 and 3 for differential amplifier having P channel JFET's, it is evident that the present invention may also use differential amplifier having N channel JFETs.

It should also be noted that the theory of the present invention of using a pair of resistors in the trim circuit one of which has a substantial temperature coefficient being the non-trim resistor and the low temperature coefficient transistor being the trim resistor is applicable in theory to insulated gate field effect transistors. In actuality, the insulated gate field effect transistors produced by present processing technology have not been able to produce insulated gate field effect transistors such that $I_{DSS}$ and the $V_P$ or the equivalent to $V_T$ for insulated gate field effect transistors are interdependent such that $\Delta I_{DSS}/I_{DSS}$ and $\Delta V_T/V_T$ have correlated magnitudes and the same mathematical sign. These are the two major requirements such that the present trim resistor circuit is applicable to the present invention. As research continues and the processing concludes for the insulative gate field effect transistor, so that the other causes of mismatch are eliminated, the present invention it will also be applicable to insulated gate field effect transistor so that $\Delta I_{DSS}/I_{DSS}$ and $\Delta V_T/V_T$ would have a degree of correlation and the same sign. Thus, the claims of the present application should not be limited to merely junction field effect transistors but to any field effect transistors since it will not be long until the processing techniques for insulative field effect transistors will make the present invention applicable to them also.

From the preceding description of the preferred embodiment, it is evident that the objects of the invention are attained. Although the invention has been described and illustrated in detail, it is to be clearly understood that the same is by way of illustration and example only and is not to be taken by way of limitation. The spirit and scope of the invention are to be limited only by the terms of the appended claims.

What is claimed is:

1. A circuit for trimming the offset voltage of a differential amplifier and reducing post-trim offset voltage drift, comprising:
   a pair of FET input transistors forming an input stage for a pair of inputs to said differential amplifier, each of said FET input transistors having a circuit-controllable drain-to-source current, the difference between said drain-to-source currents of said FET input transistors defining a drain-to-source current mismatch; an offset voltage of said differential amplifier being a function of said drain-to-source current mismatch and mismatches from among a plurality of non-controllable variables which characterize said FET, input transistors; and
   an offset adjustment circuit for trimming said offset voltage, said offset adjustment circuit comprising an initial trimming network having a low temperature coefficient for reducing said offset voltage and a temperature-dependent resistive network of a substantially higher temperature coefficient for causing said drain-to-source current mismatch to track the decrease in said mismatches in said non-controllable variables as the ambient temperature of said circuit increases, said decrease in said drain-to-source current mismatch serving to automatically reduce said post-trim offset voltage drift.

2. A circuit as defined in claim 1, wherein each of said FET input transistors has a gate, a drain, and a source, said offset adjustment circuit being connected to said input stage of said differential amplifier through said drains of said FET input transistors.

3. A circuit as defined in claim 1, wherein said trimming network comprises first and second trim resistors and said temperature dependent resistive network comprises first and second non-trim resistors, said first trim resistor and said first non-trim resistor series-connected to one of FET input transistors, said second trim resistor and said second non-trim resistor series-connected to said other FET input transistor.

4. A circuit as defined in claim 3, wherein said first and second trim resistors are formed from a low temperature coefficient material.

5. A circuit as defined in claim 4, wherein said first and second trim resistors are thin film resistors.

6. A circuit as defined in claim 3, wherein said first and second non-trim resistors are formed from a high temperature coefficient material.

7. A circuit as defined in claim 6, wherein said first and second non-trim resistors are diffused resistors.

8. A circuit as defined in claim 3, wherein said first and second trim resistors are trimmed to reduce said offset voltage.

9. A circuit as defined in claim 1 wherein said plurality of non-controllable circuit variables includes the average value of said drain-to-source current at zero gate-source voltage.

10. A circuit as defined in claim 1, wherein said plurality of non-controllable circuit variables includes the pinch-off voltage of said FET input transistors.

11. A circuit for trimming the offset voltage of a differential amplifier and reducing post-trim offset voltage drift, comprising:
    a pair of FET input transistors forming an input stage for a pair of inputs to said differential amplifier; and
    an offset adjustment circuit for trimming an offset voltage of said differential amplifier and providing automatic reduction of said post trim offset voltage drift, said offset adjustment circuit comprising a temperature-dependent resistive network including first and second trim resistors formed from a low temperature coefficient material and first and second non-trim resistors formed from a high temperature coefficient material, said first trim resistor and said first non-trim resistor being series-connected to one of said FET input transistors, said second trim resistor and said second non-trim resistor being series-connected to said other FET input transistor.

12. A circuit as defined in claim 11, wherein said non-trim resistors are substantially identical.

* * * * *